(12) United States Patent
Mallon et al.

(10) Patent No.: US 10,394,995 B1
(45) Date of Patent: Aug. 27, 2019

(54) METHODS AND SYSTEMS FOR SCHEMATIC DRIVEN 2D CHAINING IN AN INTEGRATED CIRCUIT LAYOUT

(71) Applicant: CADENCE DESIGN SYSTEMS, INC., San Jose, CA (US)

(72) Inventors: David Mallon, Scotland (GB); Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/649,209

(22) Filed: Jul. 13, 2017

(51) Int. Cl.
*G06F 17/50* (2006.01)

(52) U.S. Cl.
CPC ................ *G06F 17/5072* (2013.01)

(58) Field of Classification Search
USPC ......................................................... 716/119
See application file for complete search history.

(56) References Cited

U.S. PATENT DOCUMENTS 6,163,877 A * 12/2000 Gupta ................ G06F 17/5068
716/122
2010/0185994 A1 * 7/2010 Pikus ................. G06F 17/5081
716/52

* cited by examiner

*Primary Examiner* — Eric D Lee
(74) *Attorney, Agent, or Firm* — Eric L. Sophir; Dentons US LLP

(57) ABSTRACT

Disclosed herein are embodiments of systems, methods, and products that generate two dimensional chains of layout devices, by retrieving the schematic orientation of schematic devices in a symbolic view, and abutting the layout devices based on the schematic orientation such that the two dimensional chains of the layout devices maintain the schematic orientation. More specifically, EDA systems and methods disclosed herein may separate the layout devices into different sets, wherein each set may contain a particular type of layout devices. For example, a first set may contain photonic waveguides and a second set may contain radio frequency (RF) transmission lines. For each set of layout devices, the EDA systems and methods deterministically and iteratively traverse through the layout devices, abutting the devices using the schematic orientation, and creating one or more two dimensional chains of the layout devices.

20 Claims, 6 Drawing Sheets

METHODS AND SYSTEMS FOR SCHEMATIC DRIVEN 2D CHAINING IN AN INTEGRATED CIRCUIT LAYOUT

RELATED APPLICATIONS

This application is related to U.S. patent application Ser. No. 15/589,731, filed on May 8, 2017, which is incorporated herein in its entirety.

TECHNICAL FIELD

This application relates generally to the field of electronic circuit design, and more specifically methods and systems for generating two dimensional chains of layout devices based upon the schematic connectivity of the layout devices.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for schematics, layouts, simulation, and verification of the complex circuits. Furthermore, EDA tools allow circuit designers to optimize a complex electronic circuit, for example, by reducing the footprints of the various circuit devices. The current version of Moore's law states that the number of transistors per square inch in an IC doubles every eighteen months. Reducing the footprint of transistors and other circuit devices, for example, by keeping them closer together will keep the pace of the explosive and exponential growth of computing power, as foreseen by Moore's law.

An EDA tool may optimize an IC design by forming a chain of abutted layout devices to reduce the device footprint of the layout devices. In other words, the EDA tool may pack the layout devices closer together or merge the layout devices (by abutting) thereby saving valuable semiconductor space in the IC. For example, the EDA tool may detect that two layout devices are sufficiently close to be abutted and may trigger an abutment process based on such detection. The EDA tool may then form chain of abutted layout devices, wherein successive layout devices are abutted to each other to form a linear chain.

However, conventional EDA tools are confined to generate a linear, one-dimensional chain of abutted layout devices. However, for layout devices for photonic and radio frequency (RF) transmission lines, the orientation of the layout devices is important to maintain the integrity of the signals passing through these devices. For example, photonic waveguides have to be arranged in a complex two dimensional pattern for light to have correct geometrical propagation through the waveguides. Similarly, RF transmission lines have to be arranged in a two dimensional pattern to avoid unnecessary reflections of the waves passing through the transmission lines.

What is therefore required is an EDA systems and EDA implemented methods to generate two dimensional chains of abutted layout devices.

SUMMARY

Embodiments disclosed herein solve the aforementioned problems and other problems by retrieving the schematic orientation of schematic devices in a symbolic view to generate two dimensional chains of layout devices in the layout view, wherein the two dimensional chains of the layout devices maintain the schematic orientation. More specifically, the EDA systems and methods disclosed herein may separate the layout devices into different sets, wherein each set may contain a particular type of layout devices. For example, a first set may contain photonic waveguides and a second set may contain radio frequency (RF) transmission lines. For each set of layout devices, the EDA systems and methods deterministically and iteratively traverse through the layout devices, abutting the devices using the schematic orientation, and creating one or more two dimensional chains of the layout devices.

In an embodiment, a computer implemented method for two dimensional chaining of circuit devices in an integrated circuit comprises: receiving, by a computer, one or more files containing database records of plurality of circuit devices and a plurality of nets interconnecting at least a portion of the plurality of circuit devices; selecting, by the computer, a set of circuit devices of a first type from the plurality of circuit devices to generate one or more two dimensional chains of abutted circuit devices; retrieving, by the computer, the schematic orientation information and connectivity information of the set of circuit devices from the corresponding database records in the one or more files, wherein the schematic orientation information indicates the angle of orientation between the respective circuit devices in the symbolic view and the connectivity information indicates whether the respective circuit devices are connected to each other; determining, by the computer, that a first circuit device should be abutted with a second circuit device based upon the connectivity information of the first and the second circuit devices, wherein the first circuit device is connected to the second circuit device, and wherein the location of the first circuit device is to be traversed prior to the location of the second circuit device; and abutting, by the computer, first circuit device with the second circuit device at an angle of orientation as indicated in the schematic orientation information of the first and second circuit devices based upon a center abutment direction to generate a two dimensional chain of abutted circuit devices containing the first and second circuit devices.

In another embodiment, a system for two dimensional chaining of circuit devices in an integrated circuit comprises: one or more computers comprising a non-transitory machine-readable media configured to store one or more files containing database records of plurality of circuit devices and a plurality of nets interconnecting at least a portion of the plurality of circuit devices; at least one computer of the one or more computers, the at least one computer coupled to the non-transitory machine readable media storing the one or more files and comprising a processor configured to: select a set of circuit devices of a first type from the plurality of circuit devices to generate one or more two dimensional chains of abutted circuit devices; retrieving the schematic orientation information and connectivity information of the set of circuit devices from the corresponding database records in the one or more files, wherein the schematic orientation information indicates the angle of orientation between the respective circuit devices in the symbolic view and the connectivity information indicates whether the respective circuit devices are connected to each other; determine that a first circuit device should be abutted with a second circuit device based upon the connectivity information of the first and the second circuit devices, wherein the first circuit device is connected to the second circuit device, and wherein the location of the first circuit device is to be traversed prior to the location of the second circuit device; and abut first circuit device with the second circuit device at an angle of orientation as indicated in the schematic orientation information of the first and second circuit devices based upon a center abutment direction to generate a two dimensional chain of abutted circuit devices containing the first and second circuit devices.

BRIEF DESCRIPTION OF THE DRAWINGS

The accompanying drawings constitute a part of this specification and illustrate embodiments of the subject matter disclosed herein.

DETAILED DESCRIPTION

Figure 1:
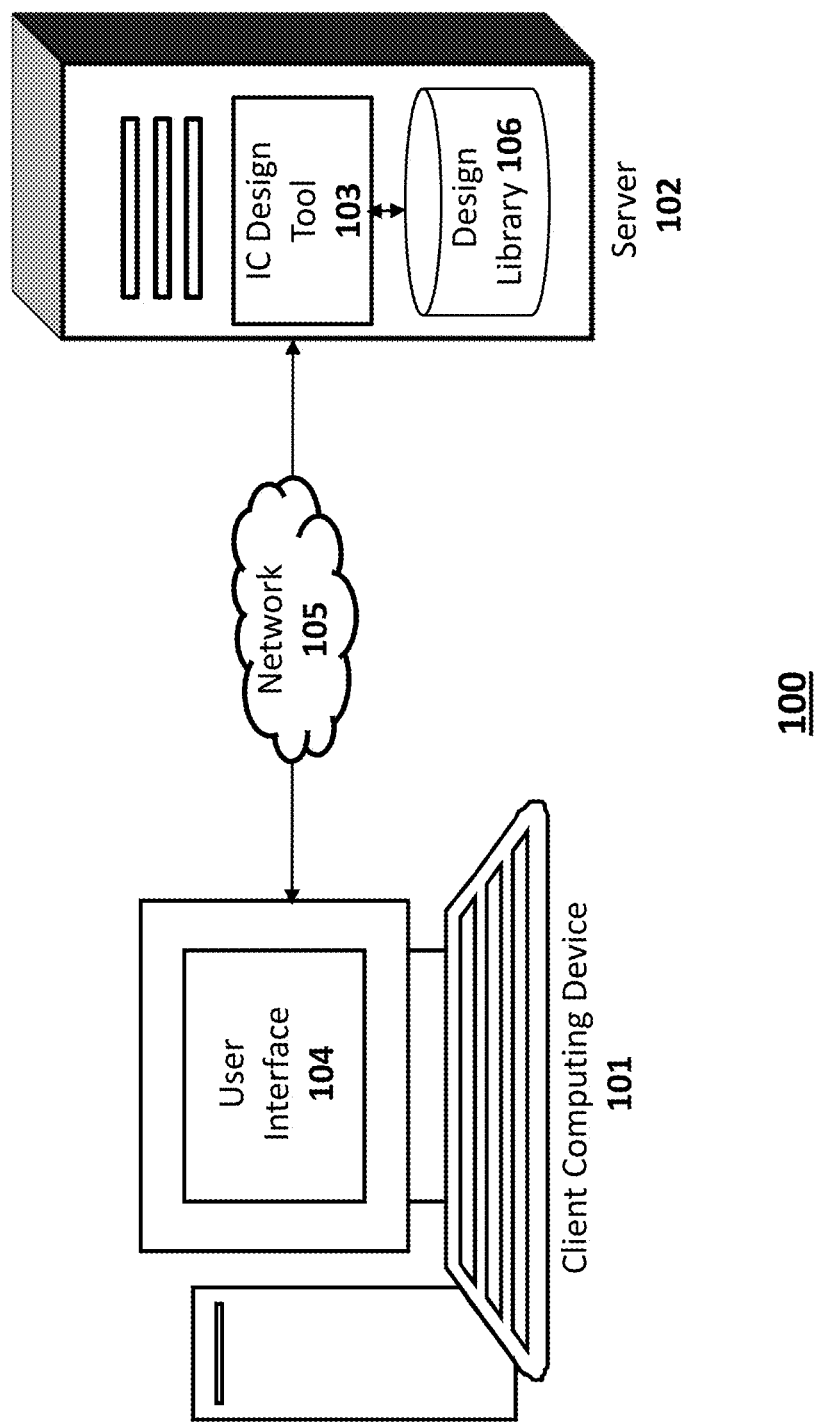
FIG. 1 shows an exemplary system for generating two dimensional chains of layout devices based upon schematic orientation, according to an exemplary embodiment.

Reference will now be made to the illustrative embodiments illustrated in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one ordinarily skilled in the relevant art and having possession of this disclosure, are to be considered within the scope of the subject matter disclosed herein. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Embodiments of the systems, products and methods disclosed herein generate one or more two dimensional chain of layout devices based upon the schematic connectivity of the corresponding schematic devices in an integrated circuit design. In other words, a two dimensional chain of layout devices may maintain the angular orientation of the corresponding schematic devices. Such schematic driven two dimensional chaining may be useful for layout devices with a simpler connectivity, for example, a two pin net and yet where the interface between the devices have to be preserved to maintain the integrity of the signal passing through the devices.

For two dimensional chaining, an electronic design automation (EDA) system may generate a separate set of layout devices based on the type of layout devices. For example, the EDA system may generate a first set of optical (or photonic) waveguide devices and a second set of radio frequency (RF) transmission line devices. The EDA system may solve the abutment problem for each of these sets separately. In other words, the EDA system may execute a first chaining algorithm to abut the optical waveguide devices to generate one or more two dimensional chains of optical waveguide devices and execute a second algorithm to generate one or more two dimensional chains of RF transmission line devices.

For each set of devices, the EDA system may traverse the layout devices starting from the bottom left of the layout canvas towards the top right of the layout canvas. Starting from the bottom left, the EDA system may abut, using a center abutment direction, and chain the layout devices based upon their connectivity and schematic orientation until the EDA system reaches a device that is not of the same type as the devices being chained. At this point, a single chain of the layout devices may be complete, and the EDA system may again move back to the bottom left of the layout canvas to generate another chain of the layout devices which were not abutted into the previous chain. Therefore, the EDA system may deterministically generate multiple discrete two dimensional chains of layout devices of the same type.

FIG. 1 illustrates an electronic design automation (EDA) system 100, according to an exemplary embodiment. The electronic design automation system 100 may include any number of computing devices; the exemplary embodiment may include a client computing device 101 and a server 102. One or more components of the electronic design automation system 100 may be grouped and referred to as an electronic design automation tool (or EDA tool). The client 101 may be connected to the server 102 via hardware and software components of one or more networks 105. In some embodiments, the system 100 may be a cloud-based system wherein one or more functionalities of the system 100 may be performed by one or more cloud computing devices. A network 105 may also connect various computing devices with databases or other components of the system 100. Examples of the network 105 include, but are not limited to, Local Area Network (LAN), Wireless Local Area Network (MILAN), Metropolitan Area Network (MAN), Wide Area Network (WAN), and the Internet. The communication over the network 105 may be performed in accordance with various communication protocols, such as Transmission Control Protocol and Internet Protocol (TCP/IP), User Datagram Protocol (UDP), and IEEE communication protocols.

A client device 101 may be any computing device comprising a processor/microcontroller and/or any other electronic component that performs one or more operations according to one or more programming instructions. The examples of the computing device may include, but are not limited to, a desktop computer, a laptop, a personal digital assistant (PDA), a smartphone, a tablet computer, and the like. The client device 101 may be configured to communicate with one or more servers 102 of the system 100 through one or more networks 105, using wired and/or wireless communication capabilities. A user interface 104 may include a Graphical User Interface (GUI) that renders an interactive, graphical representation of an IC design, layout, schematic, or other logical representation of an IC that is being designed and optimized using an IC design tool 103. The GUI 104 may provide interactive elements, such as graphical representations of IC design elements (e.g., pcell instances), for a user to manipulate the IC design layout. In some embodiments, the user interface 104 may include a text based interface allowing the user to enter manual commands for designing and optimizing the IC.

A server 102 may be accessible to the client device 101 via one or more networks 105. The server 102 may be any computing device comprising a processor and other computing hardware configured to execute an IC design tool 103 software module (e.g., EDA design software) that may analyze and optimize an IC design. In operation, using a client device 101 to access a design tool 103 hosted on a server 102 over a network 105, a circuit designer may interact with the IC design tool 103, through a number of input devices of the client device 101, such as by inputting a selection as with a mouse or inputting a request as with a keyboard. The IC design tool 103 may generate any number of graphical interface 104 responses based on the inputs received from the client device 101, and then send the data back to the client device 101 to be rendered on the GUI 104.

The server 102 may execute one or more component software modules of the IC design tool 103 software program, which may be a software program that allows users (e.g., engineers, circuit designers) to design and optimize circuit designs through software modules. The IC design tool 103 may provide users with interactive design interfaces 104 for designing an IC and the various design elements, execute automated optimization processes, and execute automated layout-generation processes. The server 102 may comprise, or may be in networked-communication with, non-transitory machine-readable media configured to store a netlist of or any other file including records of IC design elements, which may be a machine-readable computer file or a design database containing one or more records of design elements (e.g., circuit devices, peens) of the IC design. In operation, the IC design tool 103 may analyze and optimize the design elements of the netlist or any other type of file associated with the IC design. Non-limiting examples of circuit devices may include memory devices (e.g., flops), combination logic gates (e.g., AND, OR, NOT, NOR, NAND, XOR), and multiplexers, among others. The netlist or any other type of file may also include records of a plurality of nets. The nets may be the records associated with the wires interconnecting the plurality of circuit devices.

The server 102 may include a design library 106 that is accessed by the IC design tool 103. The design library 106 may include instances of various circuit devices, for example, transistors used to layout an IC. In some embodiments, the design library 106 may include instances of pcells used by the IC design tool 103 to generate an IC layout. An instance of a pcell may represent electronic circuit components such as a transistor, transmission line, or an optical fiber line. The instances of pcells may be connected through pins. For example, for a transistor pcell instance, the pins connecting the transistor pcell to other pcells in the design may be a source pin, a drain pin, and a gate pin. A pin may include one or more connecting shapes, called pin figures. For the transistor pcell instance, a pin figure for the source pin may be rectangular. For optical fibers and transmission lines, a pin figure for the pins interconnecting the segments of the optical fibers and the transmission lines may be a circular. The IC design tool 103 may use instances of pcells in the design library 106 to generate a netlist of an IC that can be sent to a manufacturing facility for fabrication.

The exemplary system 100 is shown in FIG. 1 as comprising only one server 102 for ease of explanation. However, it should be appreciated that the system 100 may comprise a number of servers 102. In some embodiments, the system 100 may comprise multiple interconnected, networked servers 102, some of which may execute various software modules configured to manage and control the resources and performance of the system 100. In some embodiments, the servers 102 may have parallel architectures configured to support multi-threading on multi-core workstations to handle large designs. In such embodiments, the servers 102 may be configured for distributed processing. The server 102 may be logically and physically organized within the same or different devices or structures, and may be distributed across any number of physical structures and locations (e.g., cabinets, rooms, buildings, cities).

In operation, the exemplary system 100 may group the circuit devices according to their types. For example, for example, the system 100 may generate a first set of circuit devices containing transmission line instances and a second set of circuit devices containing photonic waveguide instances. For each set, the system 100 may solve the two dimensional chaining problem separately: the system 100 may generate one or more two dimensional chains of the transmission line instances and then separately generate one or more two dimensional chains of photonic waveguide instances. To generate the one or more two dimensional chains, the system 100 may iteratively abut circuit devices of the same type based upon connectivity and using the schematic orientation information. Once the system 100 reaches the end of the chain, the system 100 may execute a next iteration to generate another discrete chain of circuit devices.

Figure 2:
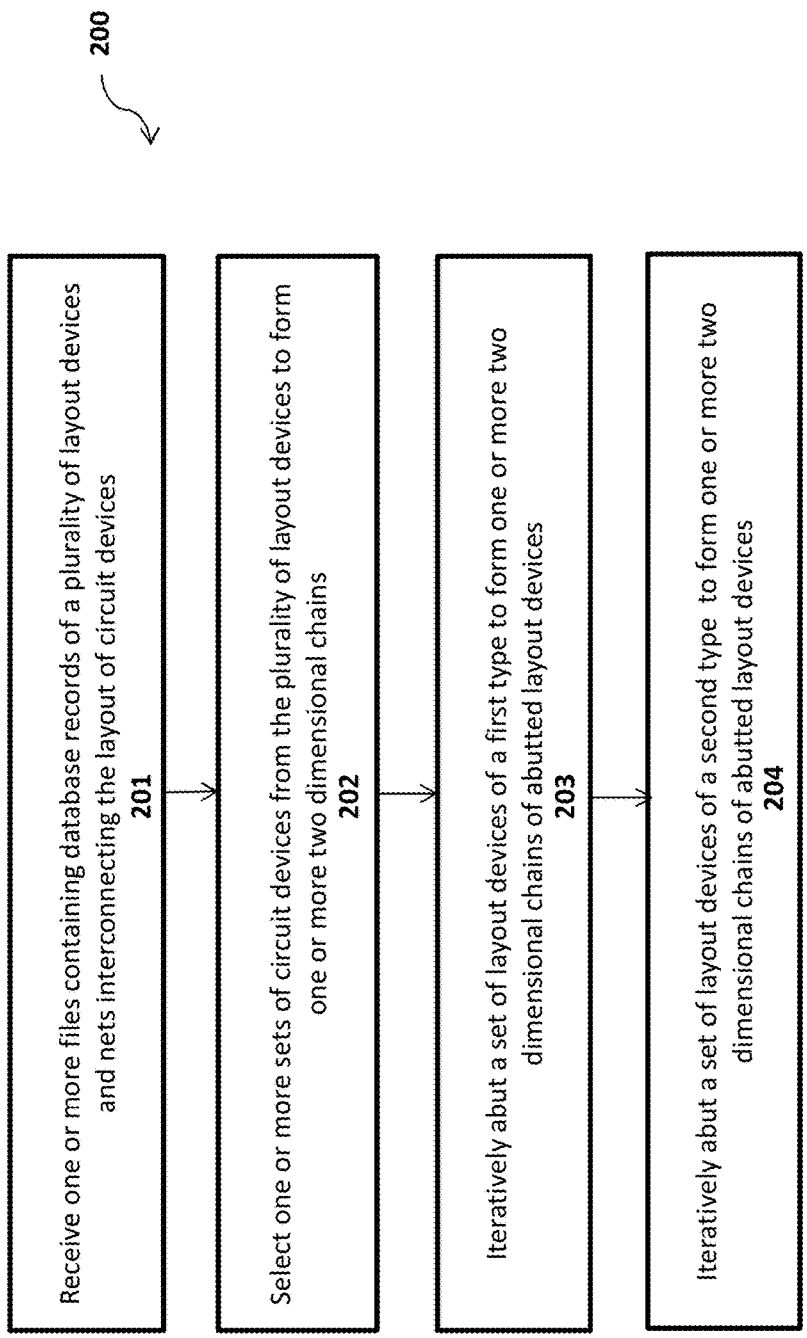
FIG. 2 shows an exemplary method for generating two dimensional chains of layout devices based upon schematic orientation, according to an exemplary embodiment.

FIG. 2 shows an exemplary method 200 for a schematic driven two dimensional chaining of layout devices in an integrated circuit (IC), according to an exemplary embodiment. Although one or more computing devices and one or more databases may implement one or more steps of the method 200, the following description details, for brevity, a computer system implementing the steps of the method 200. One having skill in the art will appreciate that some embodiments may comprise additional or alternative steps, or may omit several steps altogether.

In a first step 201, the computer system may receive one or more files containing database records of a plurality of layout devices and nets interconnecting the plurality of layout devices. The layout devices may be generated upon a cell-based IC design. In other words, the layout devices may be parameterized cell instances and/or fixed cell instances representing various circuit devices in the design such as transistors, transmission lines, and optical waveguides. The database record of a layout device may include geometrical information of the layout device such as length, width, and thickness. Furthermore, the database record for the layout device may include the information of the schematic angular orientation of the layout device. For example, in the schematic, a first layout device may be oriented at an angle from a second layout device. In some embodiments, the angular orientation may be based upon a polar co-ordinate system with the angles ranging from 0 degree to 360 degrees. The database record of the layout device may also identify the type of the layout device, for example, the layout device being a transistor, a transmission line, or an optical waveguide. The database record of a layout device may also include information of the pins of the layout device and the nets associated with the layout device. The information of the pins may include, for example, the number of pins, the shape of the pins (also known as pin figures), the orientation of the pins, and the abutment direction of the pins. The information of the nets associated with the layout device may include, for example, the number of nets, the shape and size of the net, and the association information between the pins and the nets.

In some embodiments, the computer system may receive a netlist representing a schematic IC design and generate the one or more files containing the layout devices from the netlist. The computer system may further render a symbolic view generated from the netlist and/or a layout view generated from the layout devices in a graphical user interface (GUI). A circuit designer may use the graphical user interface to manipulate the design in the symbolic view, the layout view, or both. In some embodiments, the computer system may store the schematic orientation of the layout devices separate from the one or more files containing the layout devices.

In a next step 202, the computer system may select a set of layout devices from the plurality of layout devices to form one or more two dimensional chains. In some embodiments, the computer system may select the set of layout devices based on the type of layout devices as stored in the respective database records. For example, the computer system may query the database records of the layout devices to determine the type of the layout devices such as transmission lines, photonic waveguides, and transistors. In some embodiments, a circuit designer may provide a separate list identifying the types of these devices. Based on the types of the layout devices, the computer system may select a set of layout devices, wherein the set may contain layout devices of a single type. For example, a first set may contain layout devices for transmission lines and a second set may contain layout devices for photonic waveguides. In some embodiments, the computer system may identify the categories of the devices based upon the signal types, as stored in the one the one or more files, going into and coming from the layout devices. For example transmission lines may be associated with radio frequency (RF) signals and the photonic waveguides may be associated with optical waves. As detailed below, the computer system may implement separate abutment algorithms for each set.

In some embodiments, the computer system may select the set of layout devices based upon the connectivity information. For example, the computer system may query the database records to retrieve the number of pin of the layout devices. Based on the number of pins, the computer system may select the set of layout devices, for example, layout devices having two pins. Furthermore, the computer system may query the database records to retrieve the abutment direction of the pins of the layout devices. The computer system may select the set of layout devices having pins associated with a center abutment direction. In some embodiments, the computer system may select the set of layout devices that require an angular abutment. For example, the computer system may query the database records of the layout devices to retrieve the schematic angular orientation of layout devices and select the layout devices that require an angular orientation with respect to each other.

In a next step 203, the computer system may iteratively abut the set of layout devices of a first type to form one or more two dimensional chains of abutted layout devices. In some embodiments, the computer system may use a depth-first traversal algorithm. As described in above, the computer system may have separate sets of layout devices for each type of the layout devices, such as a first set of layout devices for transmission lines and a second set of circuit devices for photonic waveguides. The computer system may initially sort the set of layout devices by their respective position in the integrated circuit design. For example, the computer system may sort the layout devices from bottom left of the design to the top right of the design such that the computer system may traverse the layout design from the bottom left to the top right.

The computer system may iteratively abut the sorted set of layout devices by traversing the layout canvas from the bottom left to the top right. For example, the computer system may start with a first layout device at co-ordinate (x1, y1) of the layout canvas and abut the first layout device with a second device having a c-ordinate of (x1+Δx, y1+Δy) towards the immediate right and top of the layout canvas. One having ordinary skill in the art understands that either Δx or Δy may be zero. To abut the first device to the second device, or any other layout devices described herein, the computer system may use the center abutment direction as disclosed in the U.S. patent application Ser. No. 15/589,731 ('731 Application), incorporated into this disclosure in its entirety. Using the center abutment direction, the computer system may abut the first and the second devices according to their relative orientation. As disclosed in the '731 Application, using the center abutment direction, the computer does not have to align the pin figures of the first and second devices and calculate the requisite offset. Instead, the computer system may overlap the center of a first pin figure of the first device and the center of a second pin figure of the second device. The center abutment direction allows the pin figures to be abutted in any relative orientation. Herein, the computer system may query the database records of the first device and/or the second device to retrieve the relative schematic angular orientation of the first and second devices. In some embodiments, the computer system may query the database records in a netlist storing the corresponding schematic design to retrieve the relative schematic angular orientation. The computer system may then select the pin figures to be abutted from each of the first and second devices, as disclosed in the '731 Application, and abut the pin figures while preserving the relative angular orientation of the first and second devices.

The computer system may abut the layout devices iteratively. After abutting the first and second devices, the computer system may traverse the layout design towards the right direction, abutting the layout devices of the same type until the computer system reaches a device of a different type or reaches the end of the design. For example, the computer system may abut a third device to the second device, and a fourth device; each of the same type as the first and second devices to generate a two dimensional chain containing the first, second, third, and fourth devices. However, when the computer system reaches a device which is not of the same type as the first, second, third, and fourth devices; the computer system may execute a second iteration of abutment again from the bottom left corner of the layout design canvas. In this iteration, the computer system may abut devices not abutted during the first iteration to generate a second two dimensional chain of abutted devices. The computer system may repeat the same process until all the device in the set are abutted into multiple two dimensional chains while preserving the schematic angular orientation.

In a next step 204, the computer system may iteratively abut a set of layout devices of a second type to form one or more two dimensional chains of abutted layout devices. The computer system may form the one or more two dimensional chains of the layout device of the same type executing the process as described above in step 203.

Figure 3A:
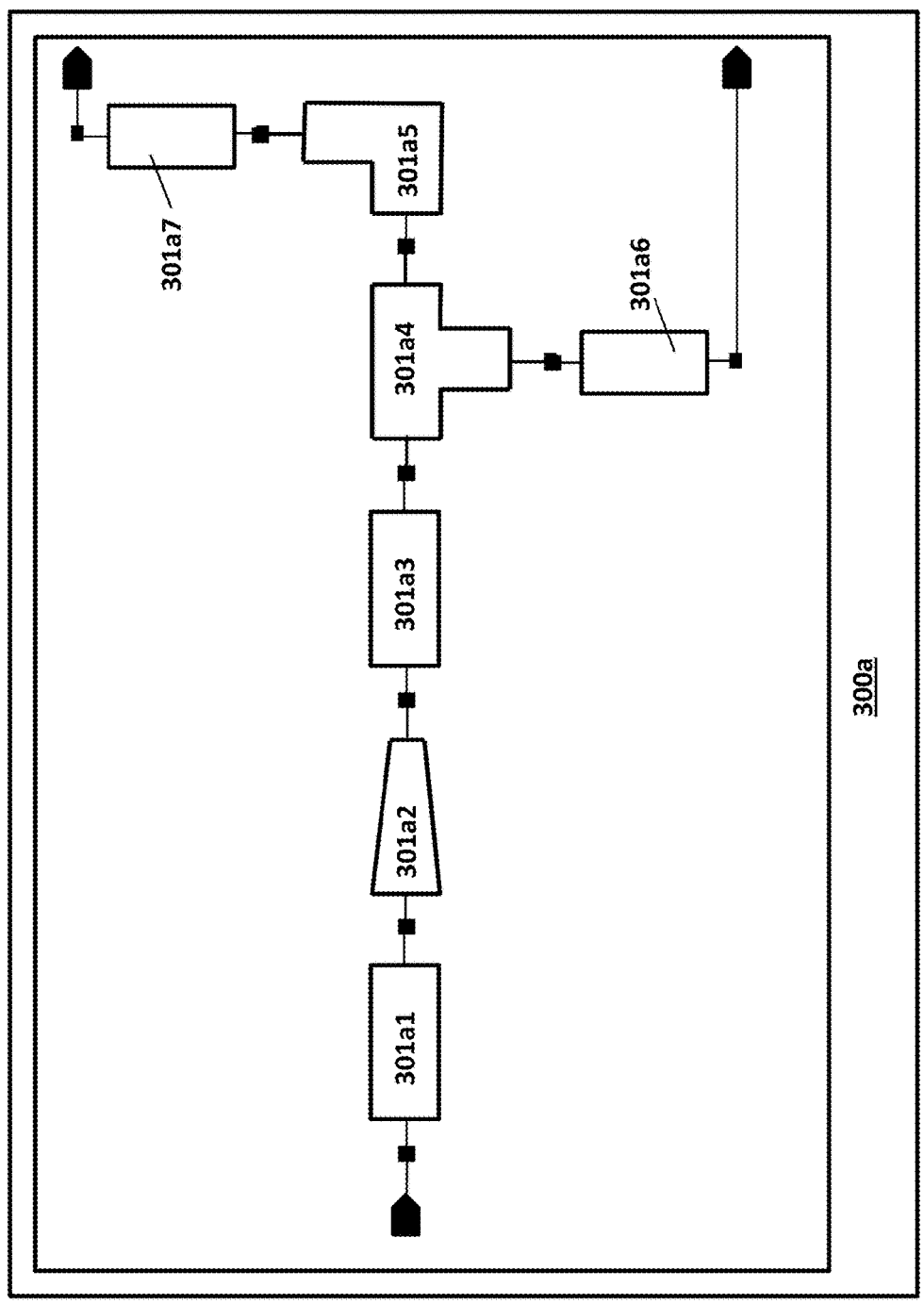
FIG. 3A shows an exemplary GUI rendering a symbolic view of schematic devices, according to an exemplary embodiment.
Figure 3B:
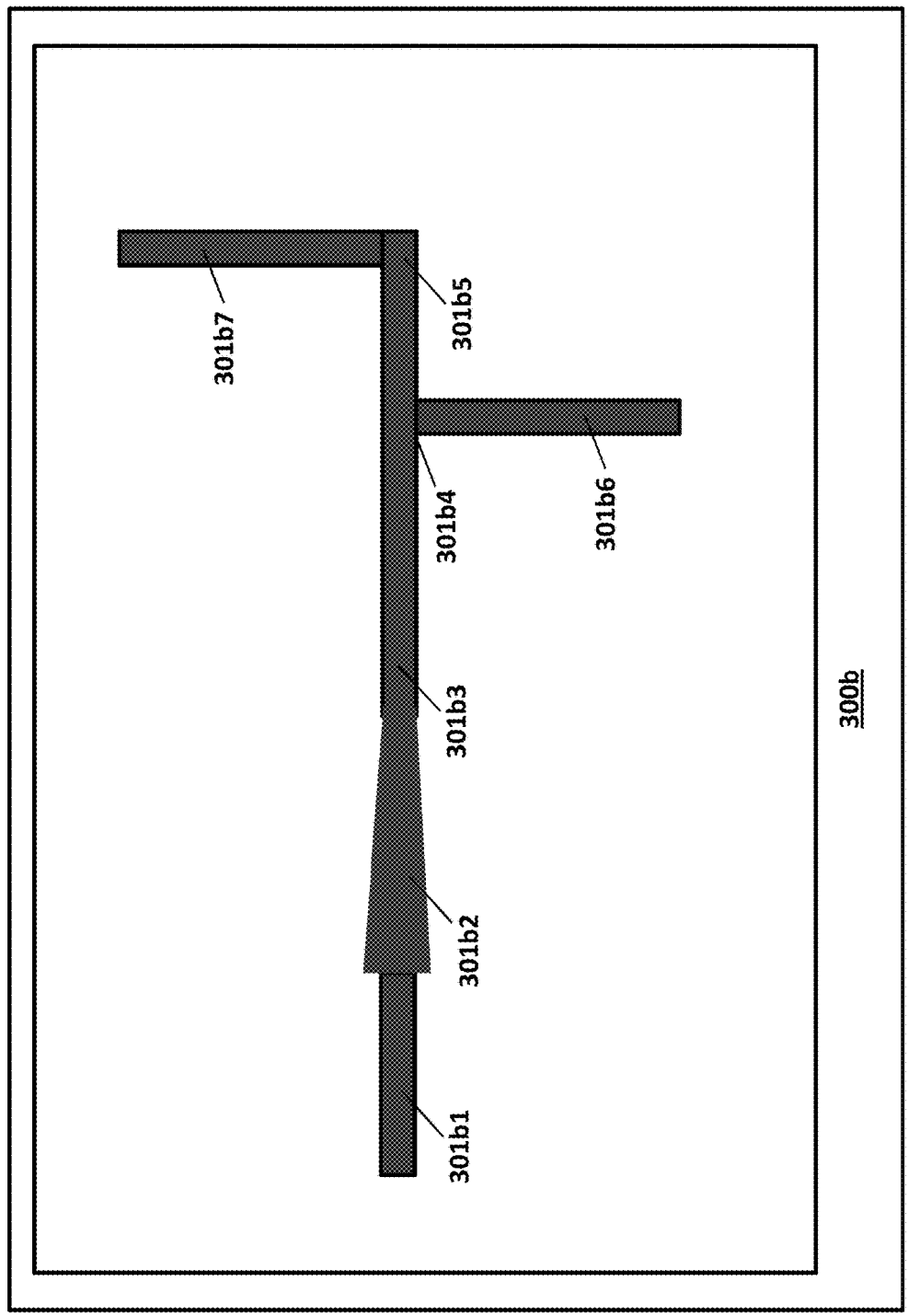
FIG. 3B shows an updated exemplary GUI showing a two dimensional chain of abutted layout devices corresponding to the schematic devices in the symbolic view shown in FIG. 3A, according to an exemplary embodiment.

FIG. 3A shows an exemplary graphical user interface (GUI) 300a rendering a symbolic view of an integrated circuit, wherein the integrated circuit may be a portion of a larger, more complex circuit. An electronic design automation (EDA) tool may generate the GUI 300a based on a netlist of the integrated circuit. The symbolic view may include schematic circuit devices (or simply schematic devices) 301a representing various types of transmission lines. For example, schematic circuit devices 301a1, 301a3, 301a6, 301a7 may represent a linear transmission line, schematic circuit device 301a2 may represent a stopper transmission lines, schematic circuit device 301a4 may represent a T-junction transmission line, and schematic circuit device 301a5 may represent an elbow junction transmission line. As seen in the GUI 300a the circuit devices may have been arranged in various orientations, as opposed to a conventional Manhattan type orientation. For example, for the schematic circuit device 301a4 representing a T-junction transmission line, there are two circuit devices at different angles, the schematic circuit device 301a5 is arranged linearly with the schematic circuit device 301a4 but the schematic circuit device 301a6 is arranged in at a 90 degree angle to the schematic circuit device 301a4. One having ordinary skill in the art appreciates that the angular orientation of the schematic circuit devices 301a should be preserved for the integrity of RF and photonic signals passing through the transmission lines, as further elaborated in '731 Application. Therefore, the EDA tool may maintain the orientation of the various devices when generating and abutting the layout circuit devices (or simply layout devices) corresponding to the schematic circuit devices 301a FIG. 3B shows an updated exemplary GUI 300b, showing a layout view corresponding to the symbolic view shown in the GUI 300a. The EDA tool may generate the layout view from the symbolic view in response to a circuit designer instructing the EDA tool to generate the layout view. The layout view includes layout devices 301b corresponding to the schematic devices 301a. More specifically, layout device 301b1 may correspond to the schematic device 301a1, layout device 301b2 may correspond to the schematic device 301a2, layout device 301b3 may correspond to the schematic device 301a3, the layout device 301b4 may correspond to the schematic device 301a4, the layout device 301b5 may correspond to the schematic device 301a5, the layout device 301b6 may correspond to the layout device 301a6, and the layout device 301b7 may correspond to the schematic device 301a7. Furthermore, the EDA tool may have abutted the layout devices 301b based on the angular orientation of the schematic devices 301a to generate a two dimensional chain as see in the exemplary GUI 300b. The chain may be considered two dimensional because the chain has layout devices 301b6, 301b7 going perpendicular to the baseline axis formed by layout devices 301b1, 301b2, 301b3, 301b4, 301b5. The aforementioned feature of two dimensional chains of abutted layout devices based upon the orientation of the schematic devices is not available in the conventional EDA tools.

Figure 4A:
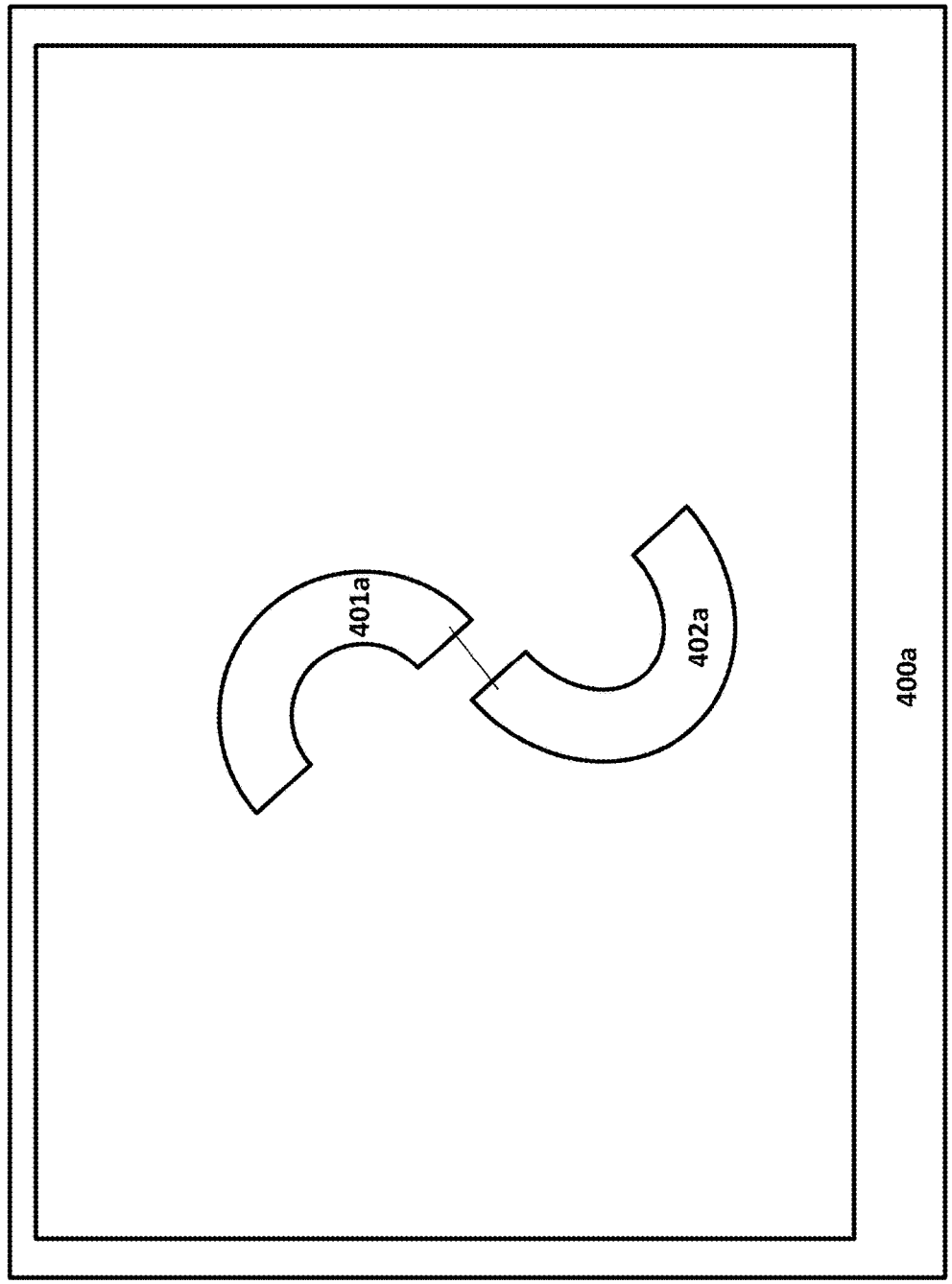
FIG. 4A shows an exemplary GUI rendering a symbolic view of schematic devices, according to an exemplary embodiment.
Figure 4B:
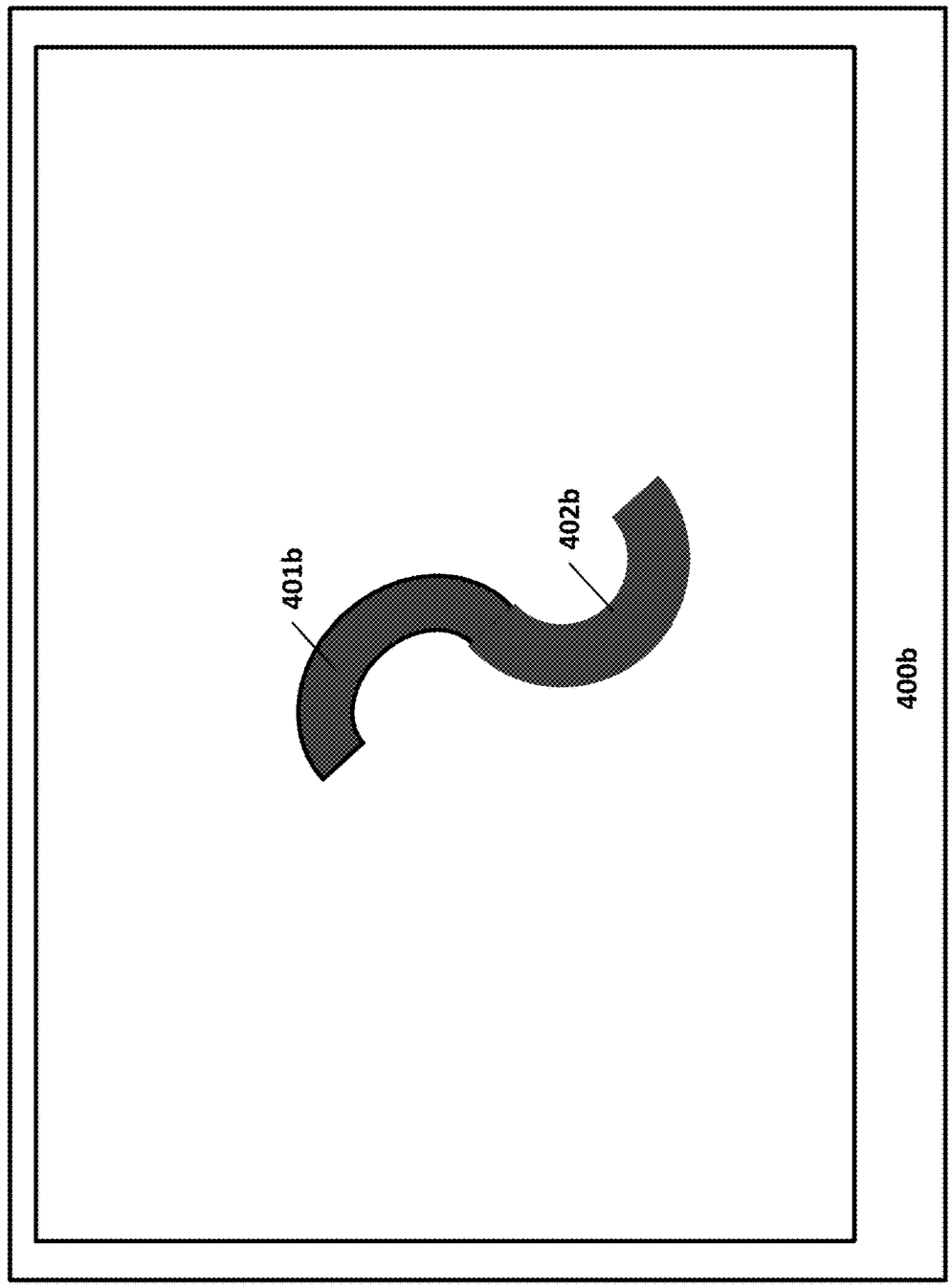
FIG. 4B shows an updated exemplary GUI showing a two dimensional chain of abutted layout devices corresponding to the schematic devices in the symbolic view shown in FIG. 4A, according to an exemplary embodiment.

FIG. 4A shows an exemplary GUI 400a showing a schematic view containing schematic devices 401a, 402a. Each of the schematic devices 401a, 402a may represent an optical waveguide. In the layout, an electronic design automation (EDA) tool may have to abut the optical waveguides to maintain the integrity of the signal passing through the waveguides. FIG. 4B shows an exemplary updated GUI 400b showing abutted layout devices 401b, 402b corresponding to the schematic devices 401a, 402a. As seen in the exemplary GUI, the EDA tool may have maintained the orientation of the schematic devices 401a, 402a in the abutted layout devices 401b, 402b to generate a two dimensional chain of abutted devices.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A computer implemented method for two dimensional chaining of circuit devices in an integrated circuit, the method comprising:
   receiving, by a computer, one or more files containing database records of a plurality of circuit devices and a plurality of nets interconnecting at least a portion of the plurality of circuit devices;
   selecting, by the computer, a set of circuit devices of a first type from the plurality of circuit devices to generate one or more two dimensional chains of abutted circuit devices;
   retrieving, by the computer, schematic orientation information and connectivity information of the set of circuit devices from the corresponding database records in the one or more files, wherein the schematic orientation information indicates the angle of orientation between the respective circuit devices in a symbolic view and the connectivity information indicates whether the respective circuit devices are connected to each other;
   determining, by the computer, that a first circuit device should be abutted with a second circuit device based upon the connectivity information of the first and the second circuit devices, wherein the first circuit device is connected to the second circuit device, and wherein the location of the first circuit device is to be traversed prior to the location of the second circuit device; and
   abutting, by the computer, the first circuit device with the second circuit device at an angle of orientation as indicated in the schematic orientation information of the first and second circuit devices based upon a center abutment direction to generate a two dimensional chain of abutted circuit devices containing the first and second circuit devices, whereby device footprint of the abutted circuit devices is reduced while the integrity of a signal passing through the abutted circuit devices is maintained.

2. The method of claim 1, further comprising:
   upon determining by the computer that a third circuit device at a location to be traversed later than the last circuit device in the two dimensional chain is not of the first type:
      determining, by the computer, that a fourth circuit device should be abutted with a fifth circuit device based upon the connectivity information of the fourth and the fifth circuit devices, wherein the fourth circuit device is connected to the fifth circuit device, and wherein the location of the fourth circuit device is to be traversed prior to the location of the fifth circuit device; and
      abutting, by the computer, the fourth circuit device with the fifth circuit device at an angle of orientation as indicated in the schematic orientation information of the fourth and fifth circuit devices based upon a center abutment direction to generate a second two dimensional chain of abutted circuit devices containing the fourth and fifth circuit devices.

3. The method of claim 2, wherein the fourth and fifth circuit devices are of the first type.

4. The method of claim 2, wherein the fourth and fifth circuit devices are of a second type different from the first type.

5. The method of claim 2, wherein at least one of the first, second, third, fourth, and fifth circuit devices is represented by a pcell instance.

6. The method of claim 2, wherein at least one of the first, second, third, fourth, and fifth circuit devices is represented by a fixed cell instance.

7. The method of claim 2, wherein at least one of the first, second, third, fourth, and fifth circuit devices is an optical waveguide.

8. The method of claim 2, wherein at least one of the first, second, third, fourth, and fifth circuit devices is a radio frequency (RF) transmission line.

9. The method of claim 1, wherein the first circuit device is a first optical waveguide and the second device is a second optical waveguide, and wherein the abutting of the first and second optical waveguide forms a combined and continuous optical waveguide.

10. The method of claim 1, further comprising:
    rendering, by the computer, the first and second circuit devices including respective sets of pin figures on a graphical user interface; and
    updating, by the computer, the graphical user interface based on abutting the first and second circuit devices.

11. A system for two dimensional chaining of circuit devices in an integrated circuit, the system comprising:
    one or more computers comprising a non-transitory machine-readable media configured to store one or more files containing database records of a plurality of circuit devices and a plurality of nets interconnecting at least a portion of the plurality of circuit devices;
    at least one computer of the one or more computers, the at least one computer coupled to the non-transitory machine readable media storing the one or more files and comprising a processor configured to:

select a set of circuit devices of a first type from the plurality of circuit devices to generate one or more two dimensional chains of abutted circuit devices;

retrieve schematic orientation information and connectivity information of the set of circuit devices from the corresponding database records in the one or more files, wherein the schematic orientation information indicates the angle of orientation between the respective circuit devices in a symbolic view and the connectivity information indicates whether the respective circuit devices are connected to each other;

determine that a first circuit device should be abutted with a second circuit device based upon the connectivity information of the first and the second circuit devices, wherein the first circuit device is connected to the second circuit device, and wherein the location of the first circuit device is to be traversed prior to the location of the second circuit device; and abut the first circuit device with the second circuit device at an angle of orientation as indicated in the schematic orientation information of the first and second circuit devices based upon a center abutment direction to generate a two dimensional chain of abutted circuit devices containing the first and second circuit devices, whereby device footprint of the abutted circuit devices is reduced while the integrity of a signal passing through the abutted circuit devices is maintained.

12. The system of claim 11, wherein the processor is further configured to:

upon determining by the processor that a third circuit device at a location to be traversed later than the last circuit device in the two dimensional chain is not of the first type:

determine that a fourth circuit device should be abutted with a fifth circuit device based upon the connectivity information of the fourth and the fifth circuit devices, wherein the fourth circuit device is connected to the fifth circuit device, and wherein the location of the fourth circuit device is to be traversed prior to the location of the fifth circuit device; and abut the fourth circuit device with the fifth circuit device at an angle of orientation as indicated in the schematic orientation information of the fourth and fifth circuit devices based upon a center abutment direction to generate a second two dimensional chain of abutted circuit devices containing the fourth and fifth circuit devices.

13. The system of claim 12, wherein the fourth and fifth circuit devices are of the first type.

14. The system of claim 12, wherein the fourth and fifth circuit devices are of a second type different from the first type.

15. The system of claim 12, wherein at least one of the first, second, third, fourth, and fifth circuit devices is represented by a pcell instance.

16. The system of claim 12, wherein at least one of the first, second, third, fourth, and fifth circuit devices is represented by a fixed cell instance.

17. The system of claim 12, wherein at least one of the first, second, third, fourth, and fifth circuit devices is an optical waveguide.

18. The system of claim 12, wherein at least one of the first, second, third, fourth, and fifth circuit devices is a radio frequency (RF) transmission line.

19. The system of claim 11, wherein the first circuit device is a first optical waveguide and the second device is a second optical waveguide, and wherein the abutting of the first and second optical waveguide forms a combined and continuous optical waveguide.

20. The system of claim 11, wherein the processor is further configured to:

render the first and second circuit devices including respective sets of pin figures on a graphical user interface; and update the graphical user interface based on abutting the first and second circuit devices.

* * * * *